US008884605B2

United States Patent
Chien

(10) Patent No.: US 8,884,605 B2
(45) Date of Patent: Nov. 11, 2014

(54) DETECTING CIRCUIT

(75) Inventor: Chun-Ta Chien, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 218 days.

(21) Appl. No.: 13/549,689

(22) Filed: Jul. 16, 2012

(65) Prior Publication Data

US 2013/0082681 A1 Apr. 4, 2013

(30) Foreign Application Priority Data

Sep. 29, 2011 (TW) .............................. 100135267 A

(51) Int. Cl.
*G01R 31/02* (2006.01)
*G09G 3/34* (2006.01)
*G09G 3/00* (2006.01)

(52) U.S. Cl.
CPC ... *G09G 3/00* (2013.01); *G09G 3/34* (2013.01)
USPC ........................................................ 324/72

(58) Field of Classification Search
USPC .................... 324/72, 757.05, 762.06, 500
See application file for complete search history.

(56) References Cited

U.S. PATENT DOCUMENTS 7,609,303 B1 * 10/2009 Lee et al. ...................... 348/241
8,013,590 B1 * 9/2011 Walschap ................... 324/76.11
2005/0103977 A1 * 5/2005 Krymski ..................... 250/208.1
2006/0077273 A1 * 4/2006 Lee et al. ...................... 348/308
2012/0256615 A1 * 10/2012 Govil et al. ..................... 324/72

FOREIGN PATENT DOCUMENTS

| CN | 201993090 U | 9/2011 |
| JP | 11327499 A | 11/1999 |
| TW | M268656 | 6/2005 |
| TW | 201033972 A | 9/2010 |
| TW | 201110670 A | 3/2011 |

OTHER PUBLICATIONS

Taiwan Patent Office, "Office Action", Jan. 15, 2014.

* cited by examiner

*Primary Examiner* — Melissa Koval
*Assistant Examiner* — Trung Nguyen
(74) *Attorney, Agent, or Firm* — WPAT, PC; Justin King

(57) ABSTRACT

A detecting circuit for detecting a feedback voltage of a pixel circuit includes a converting unit, a control chip and a display unit. The converting unit electrically connected to the pixel circuit performs an analog-to-digital operation to convert the feedback voltage into a digital signal. The control chip electrically connected to the converting unit controls the converting unit to perform the analog-to-digital operation and processes the digital signal to generate a display information. The display unit electrically connected to the control chip displays a voltage value of the feedback voltage according to the display information.

9 Claims, 6 Drawing Sheets

DETECTING CIRCUIT

FIELD OF THE INVENTION

The present invention relates to a detecting circuit for use with a pixel circuit, and more particularly to a detecting circuit for detecting a feedback voltage of a pixel circuit.

BACKGROUND OF THE INVENTION

The rapid development and wide applications of electronic paper (E-paper) displays come about as a result of the progress in semiconductor manufacturing processes, display technologies, industrial designs and communication technologies. In an electronic paper display, due to the effect of parasitic capacitance occurring in thin film transistors (TFTs) of a pixel circuit, the coupling to a variable voltage of a corresponding scan line makes the pixel voltage shift toward a negative voltage level. The pixel voltage offset ($\Delta V$) is referred to as a feedback voltage of the pixel circuit, and the voltage value of the feedback voltage can be used as a reference for setting a common voltage (Vcom) or is directly adopted as a common voltage.

However, the detection of the feedback voltage of a pixel circuit today still largely relies on a manual manner; that is, an operator on a manufacturing line has to use a multitester to detect the feedback voltage of the pixel circuit and then read the voltage value of the feedback voltage from the multitester. So, this manual detecting and reading process not only is time-consuming but also may lead to misreading.

SUMMARY OF THE INVENTION

Therefore, an objective of the embodiments according to the present invention is to provide a detecting circuit for detecting a feedback voltage of a pixel circuit so as to solve the misreading and time-consuming problem occurring in the conventional manual detecting and reading process.

The embodiment according to the present invention provides a detecting circuit for detecting a feedback voltage of a pixel circuit. The detecting circuit includes a converting unit, a control chip and a display unit. The converting unit electrically connected to the pixel circuit performs an analog-to-digital operation to convert the feedback voltage into a digital signal. The control chip electrically connected to the converting unit controls the converting unit to perform the analog-to-digital operation and processes the digital signal to generate a display information. The display unit electrically connected to the control chip displays a voltage value of the feedback voltage according to the display information.

In summary, the present invention discloses a detecting circuit capable of automatically detecting a feedback voltage of an electronic paper display instead of detecting, reading and recording the feedback voltage in a manual manner. Therefore, the misreading as well as the time-consuming process occurred in the conventional manual detecting manner can be prevented.

BRIEF DESCRIPTION OF THE DRAWINGS

The above embodiments will become more readily apparent to those ordinarily skilled in the art after reviewing the following detailed description and accompanying drawings, in which.

DETAILED DESCRIPTION OF PREFERRED EMBODIMENTS

For illustrating the objectives, technical means and advantages of the present invention in a clearer way, the present invention is described with reference to the drawings and embodiments. It is to be understood that the embodiments are used for illustrating the present invention rather than limiting the present invention.

The present invention discloses a detecting circuit for automatically detecting a feedback voltage of a pixel circuit in an electronic paper (E-paper) display. Therefore, misreading as well as the time-consuming problems occurring in the conventional manual detecting means can be prevented.

Figure 1:
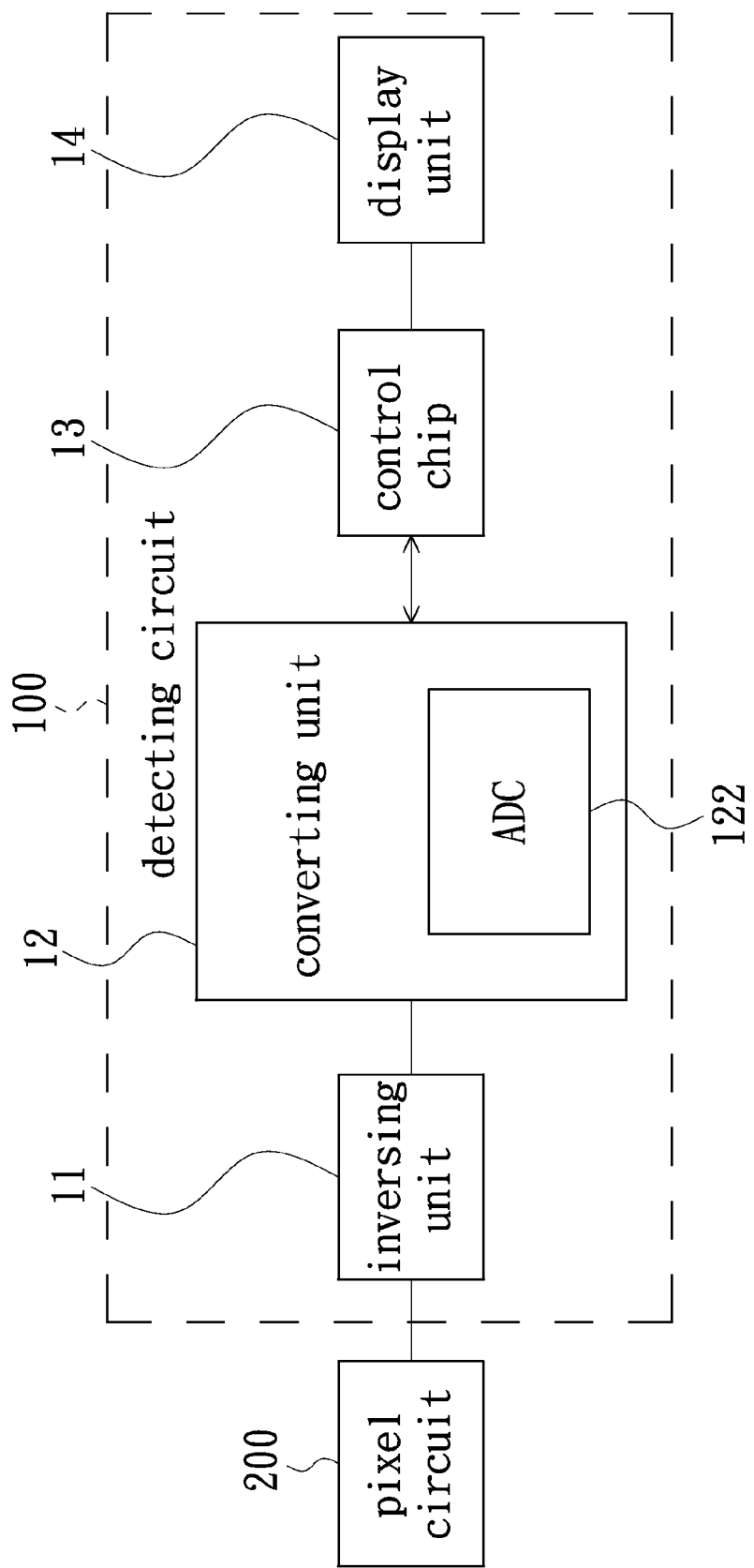
FIG. 1 is a schematic block diagram of a detecting circuit in accordance with an embodiment of the present invention.

FIG. 1 is a schematic block diagram of a detecting circuit in accordance with an embodiment of the present invention. In an electronic paper display, due to the effect of parasitic capacitance occurring in thin film transistors (TFTs) of a pixel circuit, the coupling to a variable voltage of a corresponding scan line makes the pixel voltage shift toward a negative voltage level. The pixel voltage offset ($\Delta V$) is referred to as a feedback voltage of the pixel circuit, and the voltage value of the feedback voltage can be used as a reference for setting a common voltage (Vcom) or is directly adopted as a common voltage. Therefore, as shown in FIG. 1, the detecting circuit 100 in this embodiment, built in an electronic paper display (not shown) and electrically connected to a pixel circuit 200 of the electronic paper (E-paper) display, is used to detect the feedback of the pixel circuit 200.

The detecting circuit 100 includes an inversing unit 11, a converting unit 12, a control chip 13 and a display unit 14. The inversing unit 11 electrically connected to the pixel circuit 200 receives the feedback voltage from the pixel circuit 200 and generates an output voltage according to the received feedback voltage. Specifically, the inversing unit 11, for example, includes an inversing and amplifying circuit, which is implemented with an inverting operational amplifier for converting the feedback voltage with a negative level into the output voltage with a positive level. Alternatively, the inverting operational amplifier may convert the feedback voltage with a positive level into the output voltage with a negative level.

The converting unit 12 electrically connected to the inversing unit 11 receives the output voltage from the inversing unit 11 and outputs an output signal according to the received output voltage. In the present embodiment, the converting unit 12 includes an analog-to-digital converting unit (ADC) 122 for converting the output voltage from an analog signal into a digital signal.

The conversion from the analog output voltage to the digital output signal performed by the converting unit 12 is controlled by the control chip 13. Specifically, the control chip 13 controls the ADC 122 to sample the analog output voltage a certain number of times so as to obtain a corresponding number of digital output voltages. The digital output voltages are sequentially outputted from the converting unit 12 to the control chip 13 to be averaged so as to generate a display information, which contains the information of the averaged voltage value of the feedback voltage. The display information is transmitted from the control chip 13 to the display unit 14 to be displayed. In the present embodiment, the control chip 13, for example, is implemented with one or a combination selected from a field programmable gate array (FPGA) integrated circuit, a micro control unit (MCU) and an advanced RISC machine (ARM) processor. The display unit 14, for example, is a seven-segment display for displaying the contents of the display information provided by the control chip 13.

Figure 2:
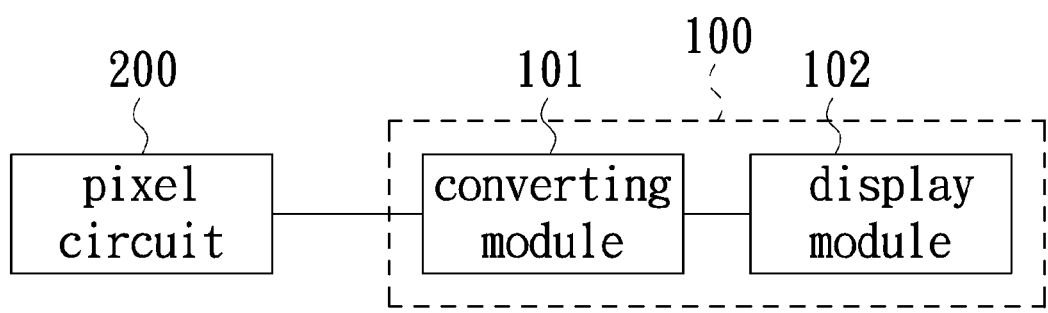
FIG. 2 is a schematic block diagram showing integration of a detecting circuit in accordance with an embodiment of the present invention.
Figure 3:
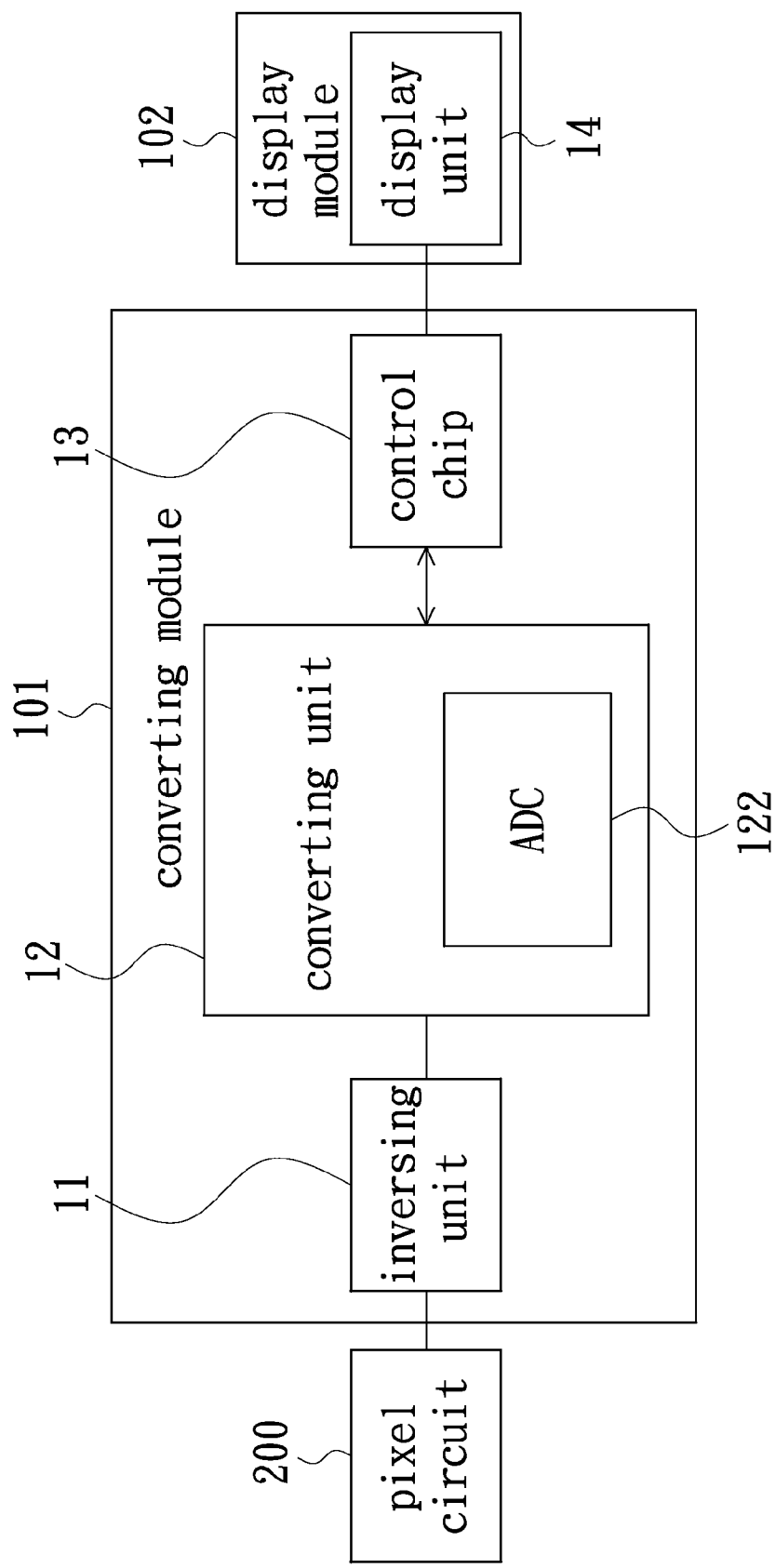
FIG. 3 is a schematic block diagram showing the detecting circuit of FIG. 1, which is modulated based on the configuration of FIG. 2.

In an embodiment, the inversing unit 11, the converting unit 12 and the control chip 13 can be integrated into a converting module 101, and the display unit 14 can be disposed in a display module 102, thereby forming the detecting circuit 100 of FIG. 1, as illustrated in FIG. 2 and FIG. 3. The converting module 101 is electrically connected to the pixel circuit 200, and the display module 102 is electrically connected to the converting module 101. The converting module 101 receives the feedback voltage from the pixel circuit 200, inverts and digitalizes the feedback voltage, and then generates and outputs the display information based on the output signal. The display module 102 receives the display information from the converting module 101 and displays the voltage value of the feedback voltage of the pixel circuit 200 according to the received display information.

Likewise, the inversing unit 11 may convert the feedback voltage with a negative voltage level into the output voltage with a positive level, or convert the feedback voltage with a positive voltage level into the output voltage with a negative level. The display information is derived from a plurality of digitalized signals, which are averaged by the control chip 13, and then outputted by the converting module 101 to the display module 102 to be displayed by the display unit 14.

Figure 4:
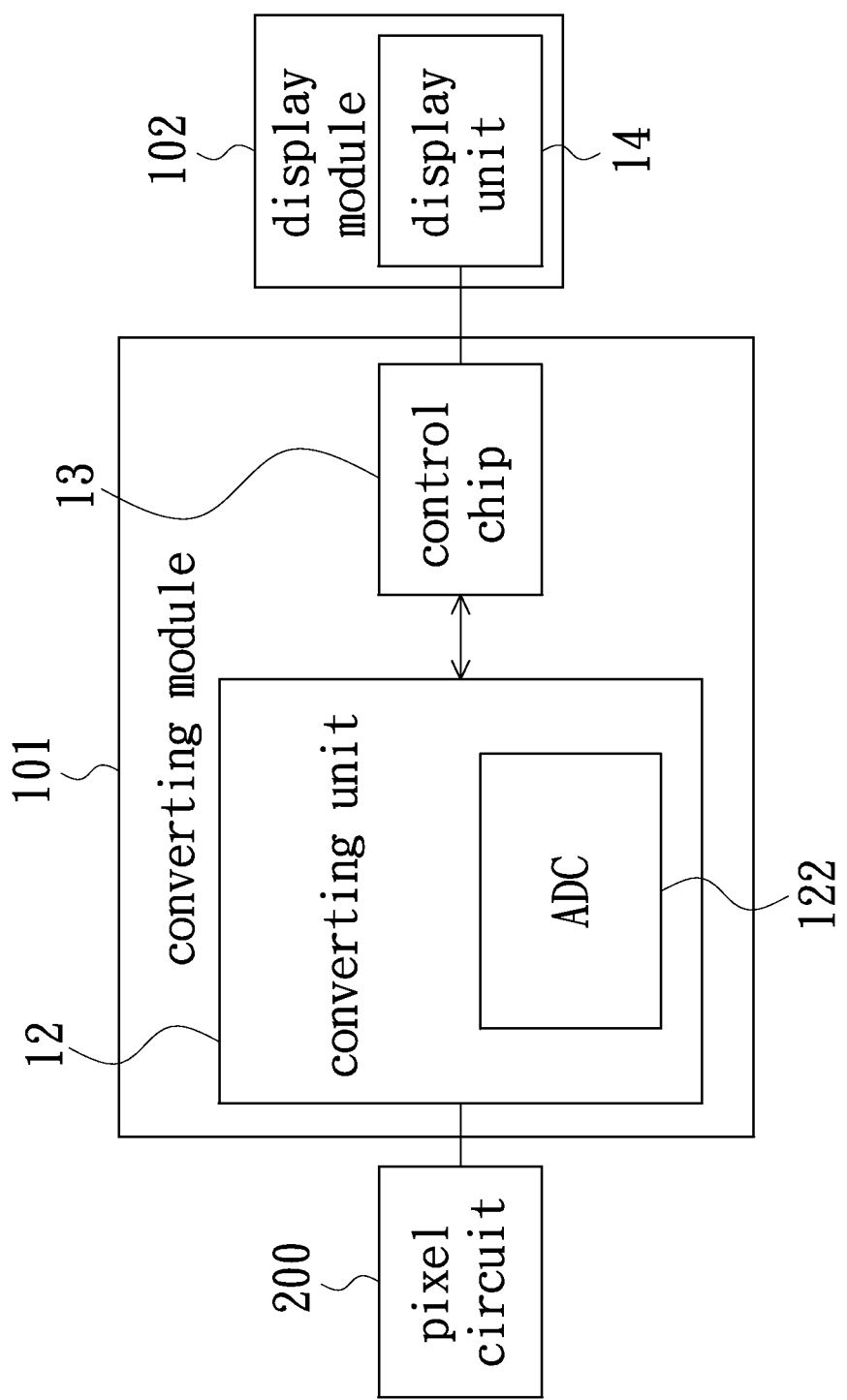
FIG. 4 is a schematic block diagram of a detecting circuit in accordance with another embodiment of the present invention, which is modulated based on FIG. 2.

Alternatively, the inversing unit 11 may be omitted from the converting module 101, as illustrated in FIG. 4, if only the negative (or positive) part of the feedback voltage is concerned. As shown, the converting module 101 includes the converting unit 12 and the control chip 13 and the display module 102 includes the display unit 14. The feedback voltage of the pixel circuit 200 is directly transmitted to the converting unit 12 to be converted into the digital signal without being inverted.

Figure 5:
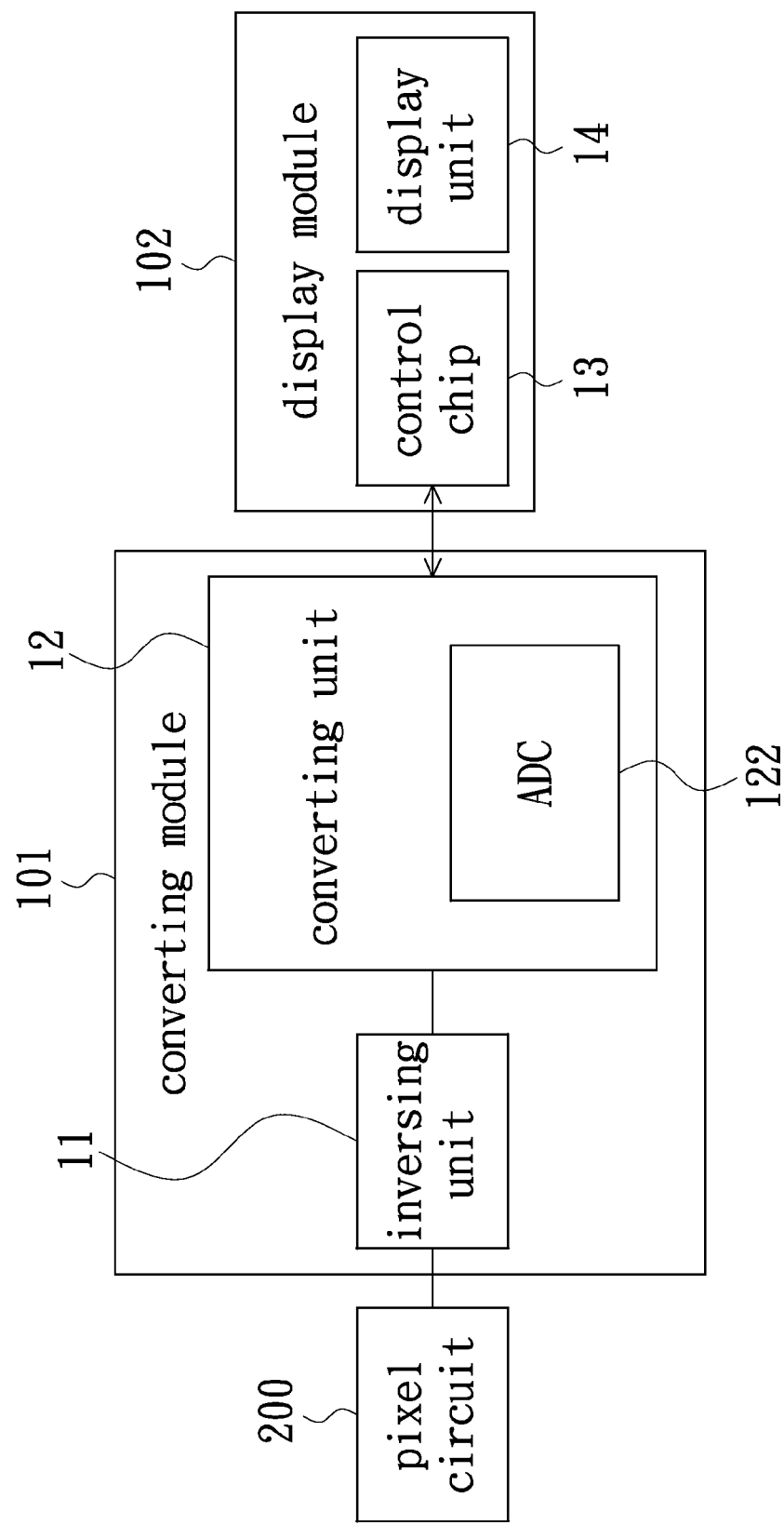
FIG. 5 is a schematic block diagram of a detecting circuit in accordance with a further embodiment of the present invention, which is modulated based on FIG. 2.

In another alternative embodiment as illustrated in FIG. 5, the control chip 13 is integrated into the display module 102 instead of the converting module 101. As shown, the converting module 101 includes the inversing unit 11 and the converting unit 12 and the display module 102 includes the control chip 13 and the display unit 14. As described above, the digital output voltages are then sequentially outputted from the converting unit 12 to the control chip 13 to be averaged so as to generate a display information. The display information is then transmitted from the control chip 13 to the display unit 14 to be displayed.

Figure 6:
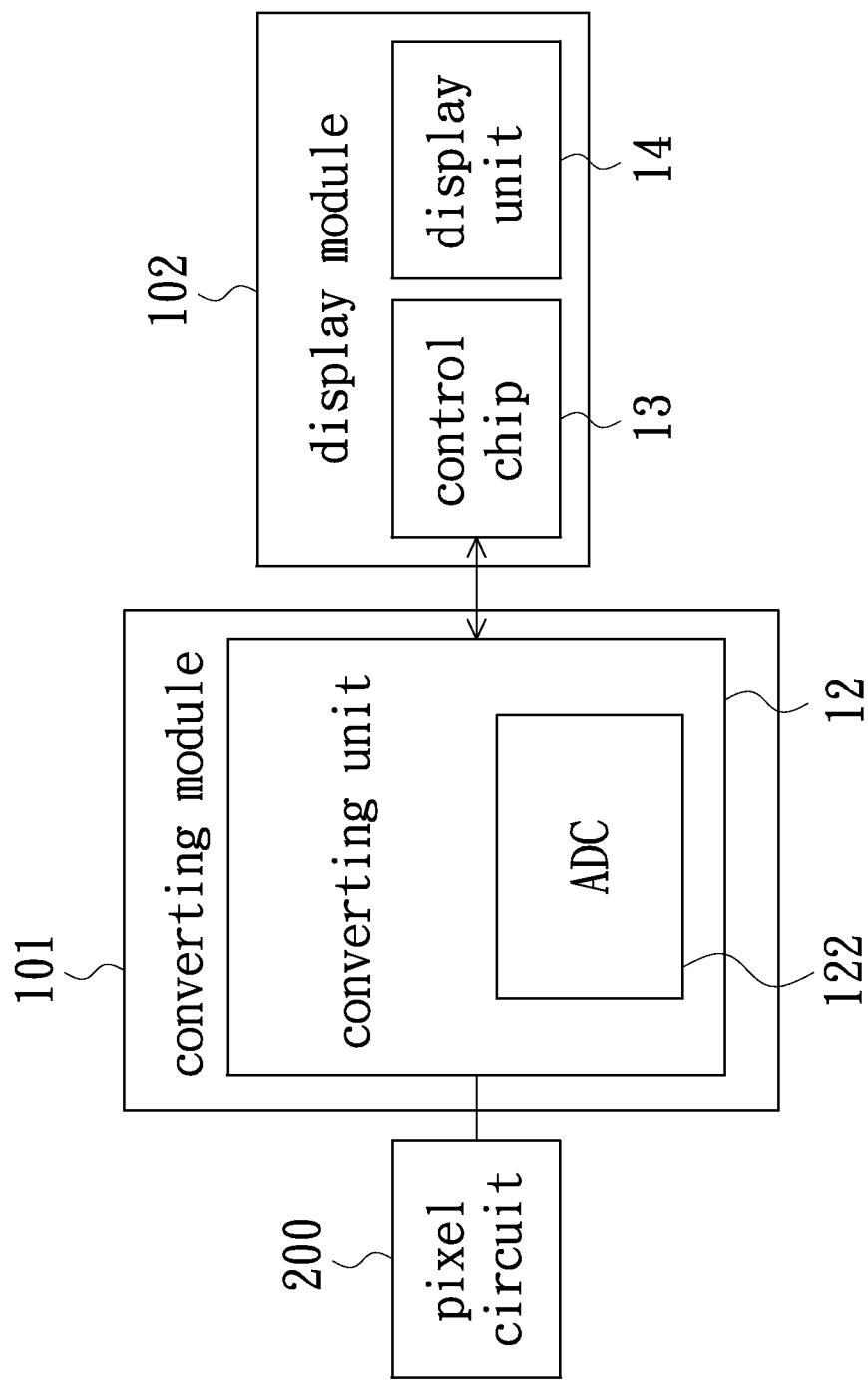
FIG. 6 is a schematic block diagram of a detecting circuit in accordance with still another embodiment of the present invention, which is modulated based on FIG. 2.

FIG. 6 schematically illustrates another alternative embodiment of the detecting circuit 100 of FIG. 1, in which the inversing unit 11 is omitted, and the control chip 13 is disposed in the display module 102. As shown, the converting module 101 includes the converting unit 12 and the display module 102 includes the control chip 13 and the display unit 14. The inversing unit 11 may be omitted from the converting module 101 if only the negative (or positive) part of the feedback voltage is concerned.

In summary, the detecting circuit according to the present invention is capable of automatically detecting a feedback voltage of an electronic paper display instead of detecting, reading and recording the feedback voltage in a manual manner. Therefore, the misreading as well as the time-consuming problems occurring in the conventional manual detecting means can be prevented.

What is described above is preferred embodiments according to the present invention only rather than used for limiting the present invention. On the contrary, it is intended to cover various modifications and similar arrangements included within the spirit and scope of the appended claims which are to be accorded with the broadest interpretation so as to encompass all such modifications and similar structures.

What is claimed is:

1. A detecting circuit for detecting a feedback voltage of a pixel circuit, comprising:
    a converting unit electrically connected to the pixel circuit for performing an analog-to-digital operation to convert the feedback voltage into a digital signal;
    a control chip electrically connected to the converting unit for controlling the converting unit to perform the analog-to-digital operation, and processing the digital signal to generate a display information; and
    a display unit electrically connected to the control chip for displaying a voltage value of the feedback voltage according to the display information;
    wherein the control chip controls the converting unit to sample the feedback voltage a number of times so as to generate a corresponding number of digital outputs, and then averages the digital outputs to generate the display information.

2. The detecting circuit according to claim 1, further comprising an inversing unit electrically connected between the pixel circuit and the converting unit for converting a voltage level of the feedback voltage before the analog-to-digital operation.

3. The detecting circuit according to claim 2, wherein the inversing unit converts the feedback voltage from a negative level to a positive level or from a positive level to a negative level.

4. The detecting circuit according to claim 3, wherein the inversing unit comprises an inverting operational amplifier for converting the voltage level of the feedback voltage.

5. The detecting circuit according to claim 1, wherein the control chip is implemented with one or a combination selected from a field-programmable gate array integrated circuit, a micro control circuit and an advanced RISC machine processor.

6. The detecting circuit according to claim 1, wherein the display unit is a seven-segment display.

7. The detecting circuit according to claim 1, wherein the control chip and the display unit are integrated into a display module.

8. The detecting circuit according to claim 1, wherein the control chip and the converting unit are integrated into a converting module.

9. The detecting circuit according to claim 1, wherein the detecting circuit and the pixel circuit are built in an electronic paper display.

* * * * *